United States Patent [19]

Makihara et al.

[11] Patent Number: 5,243,573
[45] Date of Patent: Sep. 7, 1993

[54] SENSE AMPLIFIER FOR NONVOLATILE SEMICONDUCTOR STORAGE DEVICES

[75] Inventors: Hiroyasu Makihara; Kenji Kohda, both of Hyogo, Japan

[73] Assignee: Mitsubishi Denki Kabushiki Kaisha, Tokyo, Japan

[21] Appl. No.: 745,303

[22] Filed: Aug. 15, 1991

[30] Foreign Application Priority Data

Sep. 7, 1990 [JP] Japan .................. 2-238169

[51] Int. Cl.$^5$ .............................. G11C 7/00
[52] U.S. Cl. ................. 365/205; 365/189.09; 365/210
[58] Field of Search .......... 365/205, 207, 208, 210, 365/189.09, 226

[56] References Cited

U.S. PATENT DOCUMENTS

| | | | |
|---|---|---|---|
| 4,301,518 | 11/1981 | Klaas | 365/185 |
| 4,884,241 | 11/1989 | Tanaka et al. | 365/210 |
| 4,933,906 | 6/1990 | Terada et al. | 365/208 |
| 4,982,364 | 1/1991 | Iwahashi | 365/189.09 |

OTHER PUBLICATIONS

A 68-ns 4-Mbit CMOS EPROM with High-Noise-Immunity Design, IEEE Journal of Solid-State Circuits, vol. 25, No. 1, Feb. 1990.

*Primary Examiner*—Joseph A. Popek
*Attorney, Agent, or Firm*—Lowe, Price, LeBlanc & Becker

[57] ABSTRACT

A sense amplifier for nonvolatile semiconductor storage devices, wherein a first reference voltage is generated from a first reference voltage generating circuit and a second reference voltage is generated from a second reference voltage generating circuit. A latch type sense amplifier is provided, which is connected to a bit line via a selection transistor. The latch type sense amplifier includes input/output terminals in two directions and serves to latch information when the input voltage at one input/output terminal is higher than the voltage at the other input/output terminal. A first gate transistor, conductive in response to the second reference voltage, is connected between the output of the first reference voltage generating circuit and the one input/output terminal for the latch type sense amplifier. A second gate transistor, conductive in response to the second reference voltage, is connected between a load and the other input/output terminal of the latch type sense amplifier.

11 Claims, 6 Drawing Sheets

DUMMY BIT LINE

BIT LINE

SENSE AMPLIFIER FOR NONVOLATILE SEMICONDUCTOR STORAGE DEVICES

DESCRIPTION OF THE INVENTION

1. Field of the Invention

This invention relates generally to sense amplifiers for nonvolatile semiconductor storage devices. More particularly, this invention relates to sense amplifiers contained in a PROM.

2. Description of the Background Art

FIG. 7 is a schematic block diagram showing the entire arrangement of a conventional PROM. Referring to FIG. 7, an address signal is stored in an address buffer 1 and then it is fed to a row decoder 2 and a column decoder 3. The address signal stored in the row decoder 2 designates a row address of a memory matrix 4. The address signal stored in the column decoder 3 designates a column address of the memory matrix 4 via a Y gate circuit 5. Such control signals as a write enable signal E, a chip enable signal CE and an output enable signal OE are stored in a control signal input buffer 6 and are fed to a timing generator 7 and a control logic circuit 8. The timing generator 7 generates various timing signals, such as a sense amplifier activating signal, and applies them to a sense amplifier and output buffer 9.

In a ROM as shown in FIG. 7, when an address signal is inputted, a row address and a column address in the memory matrix 4 are designated by the row decoder 2 and a column decoder 3, and information is read out from the memory transistor of the designated address via the Y gate circuit 5, sense amplifier and output buffer 9.

FIG. 8 is an electric circuit diagram of the sense amplifier shown in FIG. 7. Referring to FIG. 8, the sense amplifier comprises P-channel transistors 12 through 14, and N-channel transistors 15 through 17. The P-channel transistor 12 has its gate supplied with a sense amplifier activating signal $\overline{SE}$ and its source supplied with voltage +V. The gate of the N-channel transistor 17 is supplied with a sense amplifier activating signal SE and its source is grounded. The gate of the P-channel transistor 13 is supplied with a reference voltage from a reference voltage generating circuit 10 via a node N1. The gate of the P-channel transistor 14 is connected to a load circuit 11 via a node N2 and is connected to a bit line 42 of the memory matrix 4 via a column selection transistor 51 included in the Y gate circuit 5 shown in FIG. 7.

The sources of the P-channel transistors 13 and 14 are interconnected and connected to the drain of the P-channel transistor 12. The drain of the P-channel transistor 13 is connected to the drain and gate of the N-channel transistor 15 and to the gate of the N-channel transistor 16. The drain of the P-channel transistor 14 is connected to a node N3 and to the drain of the N-channel transistor 16, from which a sense amplifier output is derived. The sources of the N-channel transistors 15 and 16 are connected to the drain of the N-channel transistor 17. In addition, a memory transistor 41 is connected to the junction between the bit line 42 and word line 43.

The operation of the sense amplifier shown in FIG. 8 will now be described. The sense amplifier activating signal $\overline{SE}$ assumes "L" level and SE assumes "H" level. Depending upon whether the memory transistor 41 connected to the node N2 via the column selection gate transistor 51 and bit line 42 is conductive or nonconductive, the level of the node N2, which is the output of the load circuit 11, rises or falls. For example, when the memory transistor 41 is nonconductive, the voltage at the node N2 is 1.2 V, but if the memory transistor 41 is conductive, the voltage at the node N2 is 1.0 V. On the other hand, the reference voltage generating circuit 10 feeds the gate of the P-channel transistor 13 with a voltage which is ½ the difference of the voltage which appears at the node N2 when the memory transistor 41 is nonconductive or conductive, e.g., 1.1 V. Therefore, in the case where the memory transistor 41 is nonconductive, the node N2 assumes a level which is higher than that of the node N1. In the case where the memory transistor 41 is conductive, the node N2 assumes a level which is lower than that of the node N1. The P-channel transistors 13 and 14 differentially amplify a slight difference between the reference voltage at the node N1 and the voltage in the load circuit 11 of the node N2; when the memory transistor 41 is conductive, the node N3 assumes "H" level, and when the memory transistor 41 is nonconductive, a sense amplifier signal at "L" level is delivered from the node N3.

When the memory transistor 41 is conductive, the node N3 attains "H" level which is not as high as a power source level. Furthermore, when the memory transistor 41 is nonconductive, the node N3 does not completely attain "L" level and a potential slightly higher than the ground potential appears at the node N3. Thus, the P-channel transistor 14 and N-channel transistor 16, and the P-channel transistor 13 and N-channel transistor 15 are rendered conductive at the same time; therefore, there is a drawback that the power consumption is high.

On the other hand, in DRAM, a so-called latch type sense amplifier is used which includes input terminals in two directions and which latches when the voltage at one terminal is higher than the voltage at the other. Such latch type sense amplifier is characterized in that its power consumption is lower than that of the sense amplifier shown in FIG. 8. If such latch type sense amplifier is used for the ROM shown in FIG. 7, the power consumption can be decreased. In the latch type sense amplifier, the amplitude of the voltage on the bit line which is the input of the amplifier may change from the power source level to the grounded level. However, the memory transistor of PROM is limited in the voltage between the drain and the source; thus, the bit line voltage cannot be increased. Therefore, there is a problem that the latch type sense amplifier used for RAM cannot be directly used for PROM.

SUMMARY OF THE INVENTION

Accordingly, an object of the invention is to provide a sense amplifier for nonvolatile semiconductor storage devices which is capable of achieving speed-up and decrease in power consumption by using a latch type sense amplifier.

Briefly described, a first reference voltage is generated from a first reference voltage generating circuit, and a second reference voltage is generated from a second reference voltage generating circuit. A latch type sense amplifier is provided which is connected to a bit line via a selection transistor. The latch type sense amplifier includes cross-coupled input/output terminals, and when the voltage at one input terminal is higher than that at the other, it latches information. A first gate transistor is connected between the output of the first reference voltage generating circuit and one of the input/output terminals of the latch type sense amplifier, and a second gate transistor is connected between the load and the other input/output terminal of the latch type sense amplifier. The first gate transistor is rendered conductive in response to the second reference voltage, applying the first reference voltage to one input/output terminal of the latch type sense amplifier, while the second gate transistor is rendered conductive in response to the second reference voltage, connecting the load to the other input/output terminal of the latch type sense amplifier.

Therefore, according to this invention, since the voltage which appears at the other input/output terminal in response to the second reference voltage is dropped by the second gate transistor, there is no possibility of the output level of the latch type sense amplifier being directly transmitted to the bit line, and it is possible to lower the level below the output level of the second reference voltage. In a transistor circuit in general, a large amount of current flowing through a transistor increases a response speed and a small amount thereof reduces the same. However, the present invention makes it possible to achieve decreased power consumption by using a latch type sense amplifier while maintaining a response speed approximately as high as that of a conventional sense amplifier.

In a preferred embodiment of the invention, the latch type amplifier comprises third and fourth transistors which are connected in series and whose inputs are connected to the second gate transistor and whose outputs are connected to the first gate transistor, and fifth and sixth transistors which are connected in series and whose inputs are connected to the first gate transistor and whose outputs are connected to the second gate transistor. The latch type sense amplifier is activated by seventh and eighth transistors which are rendered conductive by activation signals.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
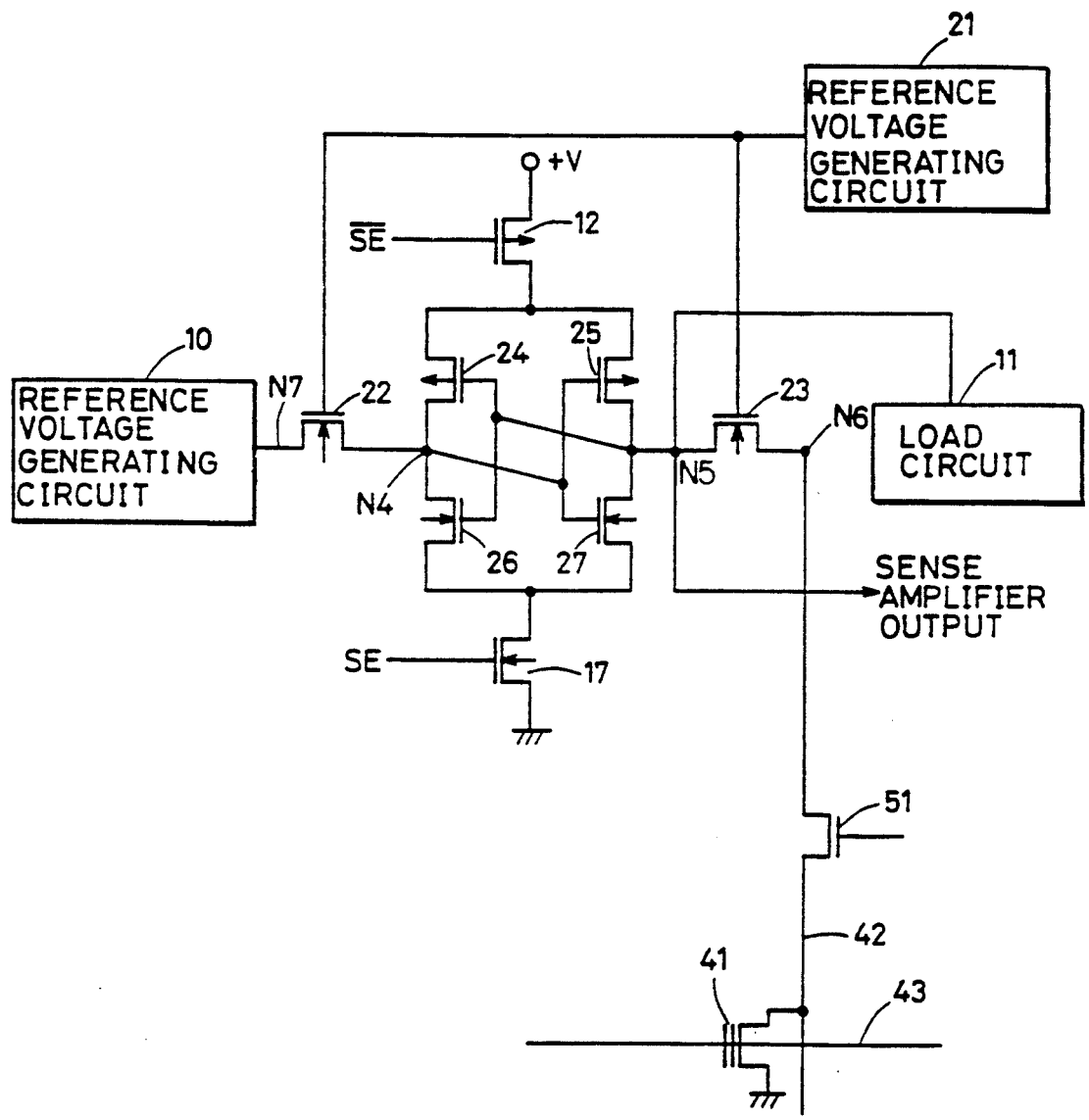
FIG. 1 is an electric circuit diagram of an embodiment of this invention.
Figure 8:
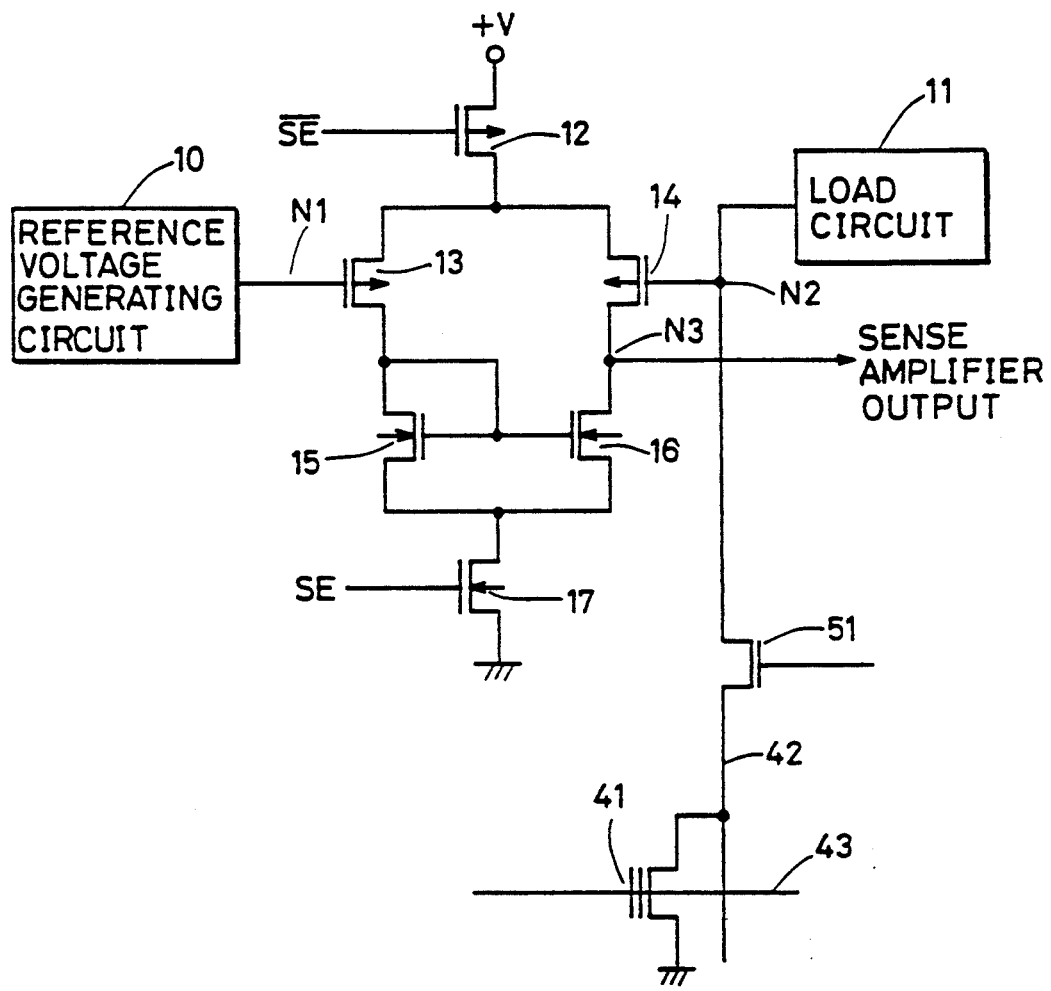
FIG. 8 is an electric circuit diagram showing a conventional sense amplifier.

FIG. 1 is an electric circuit diagram of an embodiment of this invention. The embodiment shown in FIG. 1 is constructed in the same way as in FIG. 8 described above except for the following points.

A second reference voltage generating circuit 21 is provided, and a second reference voltage generated therefrom is applied to the gates of N-channel transistors 22 and 23. The drain of the N-channel transistor 22 is connected to the output of a reference voltage generating circuit 10 via a node N7 and its source is connected to a node N4. The drain of the N-channel transistor 23 is connected to a node N5 and its source is connected to a load circuit 11 via the node N6. The drain of a P-channel transistor 12 is connected to the sources of P-channel transistors 24 and 25, and the drain of an N-channel transistor 17 is connected to the sources of N-channel transistors 26 and 27. The drain of the P-channel transistor 24 is connected to the node N4, the drain of the N-channel transistor 26, the gate of the P-channel transistor 25, and the gate of the N-channel transistor 27. The drain of the P-channel transistor 25 is connected to the node N5, the drain of the N-channel transistor 27, the gate of the P-channel transistor 24, and the gate of the N-channel transistor 26.

The operation of the sense amplifier shown in FIG. 1 will now be described. First, the sense amplifier activating signal $\overline{SE}$ is brought to "H" level, while the sense amplifier activating signal SE is brought to "L" level, deactivating the sense amplifier. In the same way as in the conventional sense amplifier shown in FIG. 1 described above, the level of the node N6 which is the output of the load circuit 11 rises or falls depending upon whether the memory transistor 41 connected via the column selection transistor 51 and bit line 42 is nonconductive or conductive. That is, when the memory transistor 41 is nonconductive, the potential at the node N6 becomes 1.2 V and when the memory transistor 41 is conductive, it becomes 1.0 V.

Further, the reference voltage generating circuit 10 applies to the node N7 a voltage which is intermediate between the two voltages which appear when the memory transistor 41 is nonconductive and conductive, respectively. The second voltage generating circuit 21 generates a second reference voltage, which is applied to the gates of the N-channel transistors 22 and 23. As a result, the N-channel transistors 22 and 23 are rendered conductive, and the voltage at the node N7 is transmitted to the node N4 via the N-channel transistor 22 and the voltage at the node N6 is transmitted to the node N5 via the N-channel transistor 23

Then, the sense amplifier activating signal $\overline{SE}$ is brought to "L" level and the sense amplifier activating signal SE is brought to "H" level, activating the sense amplifier, whereupon amplification is effected by the P-channel transistors 24 and 25 and the N-channel transistors 26 and 27 until the difference between the voltage at the nodes N5 and N4 is substantially equal to the source voltage level and the ground level. At this time, if the voltage at the node N5 is at the ground level, the voltage at the node N6 is also at the ground level. In the case where the node N5 is at the voltage source level, the node N6 is limited by the second reference voltage to be held below the level of this voltage. That is, before the sense amplifier is activated, the potential at the node N6 is 1.2 V when the memory transistor 41 is nonconductive, and the potential is 1.0 V when the same is conductive. When the sense amplifier is activated, the potential at the node N5 attains "L" level which is approximately as low as the ground potential when the memory transistor 41 is nonconductive and the potential at the node N6 is also brought to the ground potential through the gate transistor 23. Conversely, while the potential at the node N5 is 5 V approximately the same as the power source level when the memory transistor 41 is conductive, the potential at the node N6 is limited by the amount of the second reference voltage due to the gate transistor 23 to become about 1.2 V.

Therefore, the voltage applied from the column selection transistor 51 to the memory transistor 41 via the bit line 42 is limited to the second reference voltage, which makes it possible to apply a latch type sense amplifier to a PROM with no high voltage being applied to the memory transistor 41. Furthermore, the latch type sense amplifier latches the storage state of the memory transistor 41 and the output of the sense amplifier substantially attains power source level when at "H" level and a substantially attains the ground potential when at "L" level, thereby preventing current from flowing through the respective transistors 24–27 at all times, resulting in decreased power consumption. In addition, the latch type sense amplifier allows the same response speed as that of prior art to be maintained with low power consumption.

Figure 2:
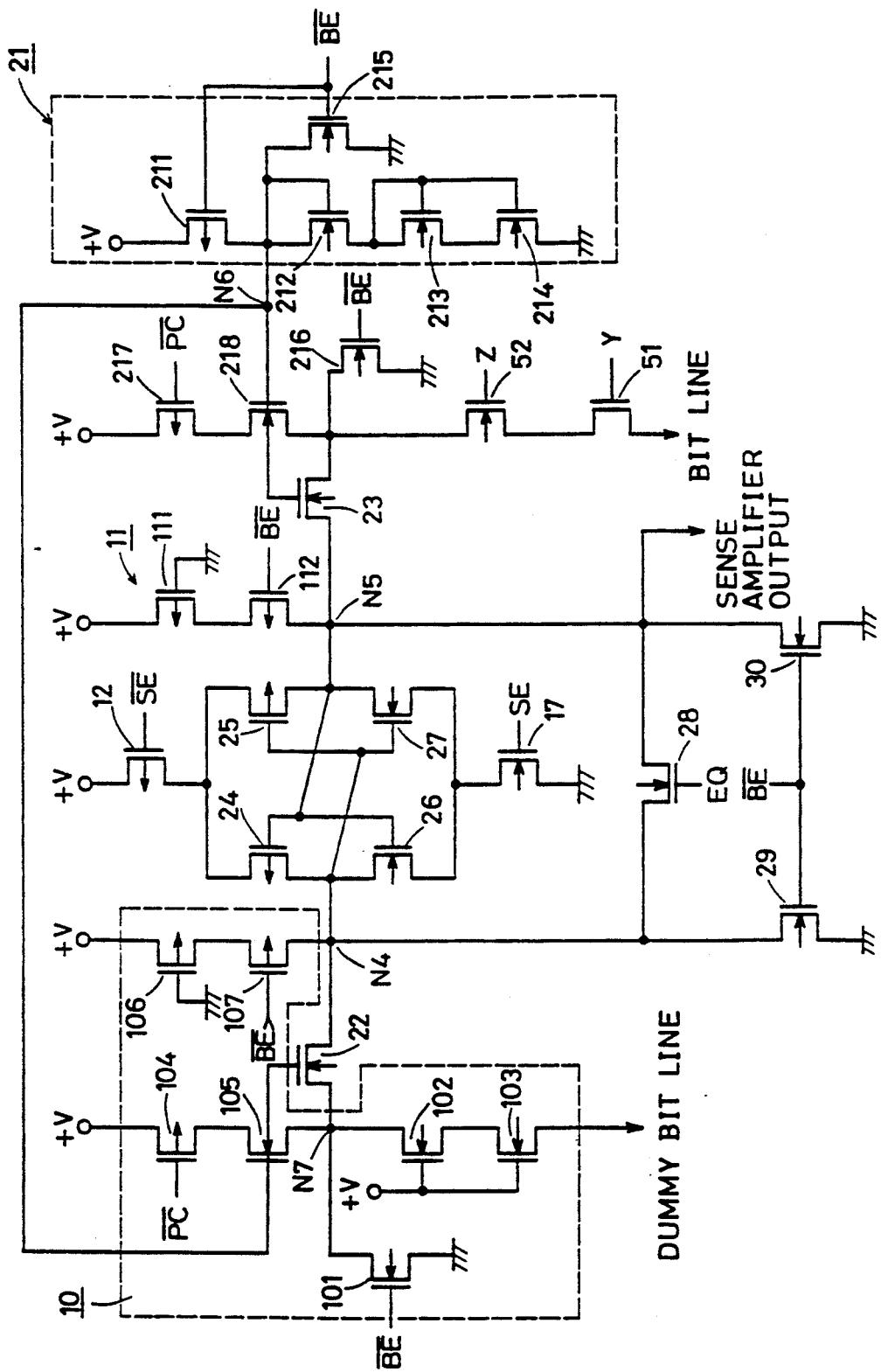
FIG. 2 is a specific electric circuit diagram of this invention.
Figure 3:
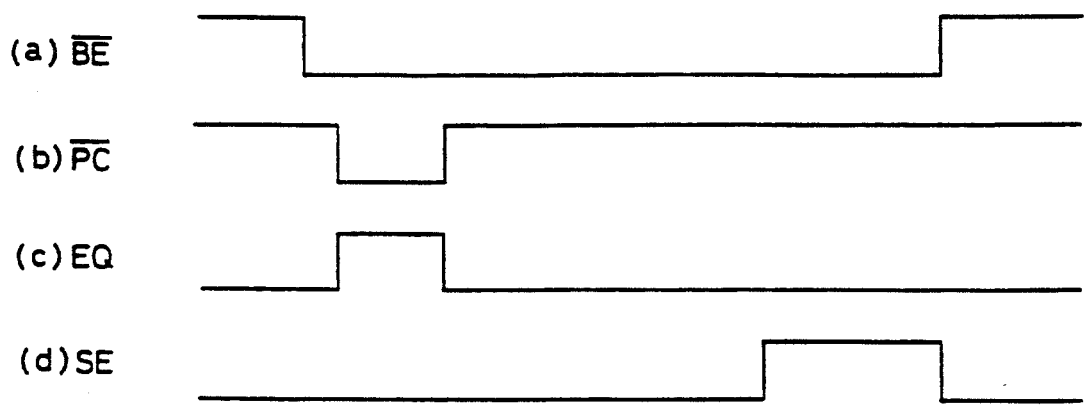
FIGS. 3a-3d are timing charts for explaining the operation of an embodiment.

FIG. 2 is a more specific electric circuit diagram of an embodiment of the invention. Referring to FIG. 2, the reference voltage generating circuit 10 comprises a P-channel transistors 104, 106, 107, and N-channel transistors 101, 102, 103, 105. The gate of the P-channel transistor 104 is supplied with a signal $\overline{PC}$, its source is supplied with +V, and its drain is connected to the drain of the N-channel transistor 105. The gate of the N-channel transistor 105 is supplied with a reference voltage from the reference voltage generating circuit 21. The source of the N-channel transistor 105 is connected to the drains of the N-channel transistors 101 and 102 and the drain of the N-channel transistor 22.

The gate of the N-channel transistor 101 is supplied with a signal $\overline{BE}$ and its source is grounded. The gates of the N-channel transistors 102 and 103 are supplied with +V, and the source of the N-channel transistor 102 is connected to the drain of the N-channel transistor 103 whose source is connected to a dummy bit line. The gate of the P-channel transistor 106 is grounded, and its source is supplied with +V and its drain is connected to the source of the P-channel transistor 107, whose gate is supplied with a signal $\overline{BE}$ and whose drain is connected to the node N4.

The reference voltage generating circuit 21 comprises a P-channel transistor connected in series between +V and the ground, N-channel transistor 212 through 214, and an N-channel transistor 215 connected between the node N6 and the ground. The gates of the P-channel transistor 211 and N-channel transistor 215 are supplied with a signal $\overline{BE}$, and the gate of the N-channel transistor 212 and the drain of the N-channel transistor 215 are connected to the node N6. The source of the N-channel transistor 215 is grounded, and the gate of the N-channel transistor 212 is connected to the gate of the node N6 and the gates of the N-channel transistors 213 and 214 are connected to the drain of the N-channel transistor 213.

Connected to the node N6 are the gates of the N-channel transistors 218 and 23 and the gates of the N-channel transistors 105 and 22 included in tho reference voltage generating circuit 10. The drain of the N-channel transistor 218 is connected to the drain of the P-channel transistor 217, whose drain is supplied with +V and whose gate is supplied with a signal $\overline{PC}$. The source of the N-channel transistor 218 is connected to the source of the N-channel transistor 23, the drain of the N-channel transistor 52, and the drain of the N-channel transistor 216. The gate of the N-channel transistor 216 is supplied with a signal $\overline{BE}$, and its source is grounded. The gate of the N-channel transistor 52 is supplied with a Z signal and its source is connected to the drain of the column selection transistor 51.

The load circuit 11 includes a series circuit of P-channel transistors 111 and 112 connected between +V and node N5. The source of the P-channel transistor 111 is supplied with +V and this gate is grounded and its drain is connected to the source of the P-channel transistor 112, whose gate is supplied with a signal $\overline{BE}$ and whose source is connected to the node N5.

The differential amplifier is constructed in the same manner as in FIG. 1 described above, comprising P-channel transistors 12, 24, 25 and N-channel transistors 17, 26, 27. Connected between the nodes N4 and N5 is the N-channel transistor 28, whose gate is supplied with a signal EQ. Connected to the node N4 is the drain of the N-channel transistor 29, whose gate is supplied with a signal $\overline{BE}$ and whose source is grounded. Connected to the node N5 is the drain of the N-channel transistor 30, whose gate is supplied with a signal $\overline{BE}$ and whose source is grounded. And a sense amplifier output is derived from the node N5.

Figure 4:
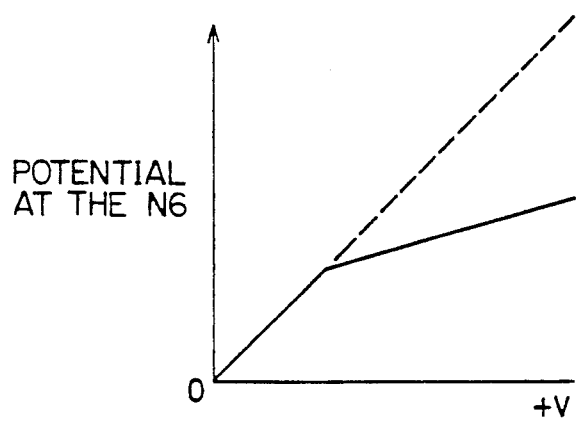
FIG. 4 is a diagram showing the characteristic of a reference voltage generated by a reference voltage generating circuit shown in FIG. 2.
Figure 5A:
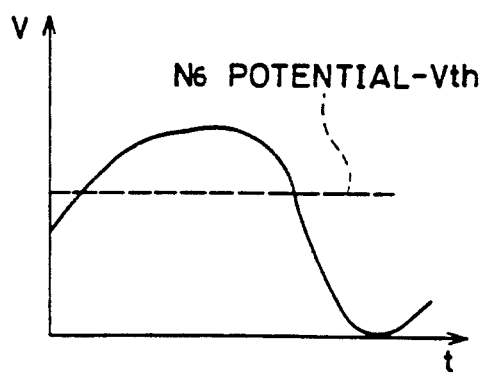
FIGS. 5a-5b are waveform diagrams showing the input and output voltages of a transfer gate shown in FIG. 4.
Figure 5B:
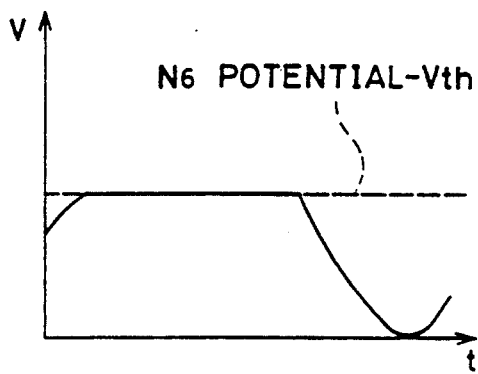
Figure 6A:
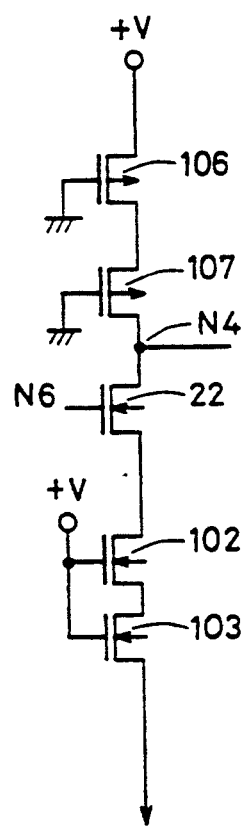
FIGS. 6a-6b are equivalent circuit diagrams of the reference voltage generating circuit and a memory sense section.

FIGS. 3a–3d are timing charts for various signals shown in FIG. 2; FIG. 4 is a diagram showing the voltage characteristics of the reference voltage generated from the reference voltage generating circuit 10 shown in FIG. 2; FIGS. 5a–5b are waveform diagrams of input and output voltages of the transfer gate shown in FIG. 4; and FIGS. 6a–6b are equivalent circuit diagrams of the reference voltage generating circuit and the sense section of the memory transistor.

Referring to FIGS. 2 through 6, the operation of an embodiment of the invention will now be described. When the signal $\overline{BE}$ shown in FIG. 3(a) is at "H" level, the N-channel transistor 101 in the reference voltage generating circuit 10 is rendered conductive so that the node N7 is grounded. The N-channel transistors 29 and 30 connected to the differential amplifier are also rendered conductive so that the nodes N4 and N5 are grounded. In the reference voltage generating circuit 21, since the N-channel transistor 215 is also rendered conductive, its node N6 is grounded. In this manner, each circuit is initialized.

When the signal $\overline{BE}$ is brought to "L" level, the N-channel transistors 101, 29, 30 and 215 are rendered nonconductive. The P-channel transistor 211 in the reference voltage generating circuit 21 is rendered conductive by the signal $\overline{BE}$, and correspondingly the N-channel transistors 212, 213 and 214 are rendered conductive. These N-channel transistors 212, 213 and 214 are considered to be a series circuit of resistors, and the potential at the node N6 has a characteristic as shown in FIG. 4. That is, the signal $\overline{BE}$ being brought to "L" level, makes the N-channel transistor 101 nonconductive and the P-channel transistor 107 conductive. An equivalent circuit for the reference voltage generating circuit 10 is as shown in FIG. 6(a) with the N-channel transistors 101 and 105 and P-channel transistor 104 omitted; the reference voltage is derived from the node N4.

Figure 6B:
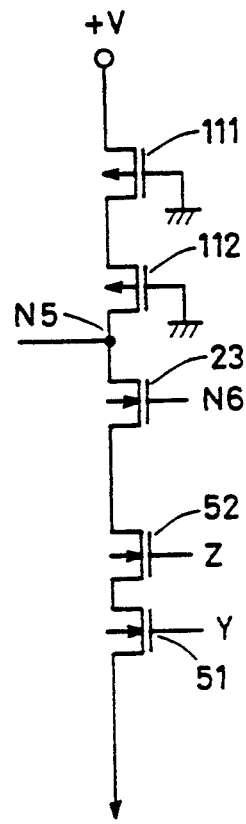
Figure 7:
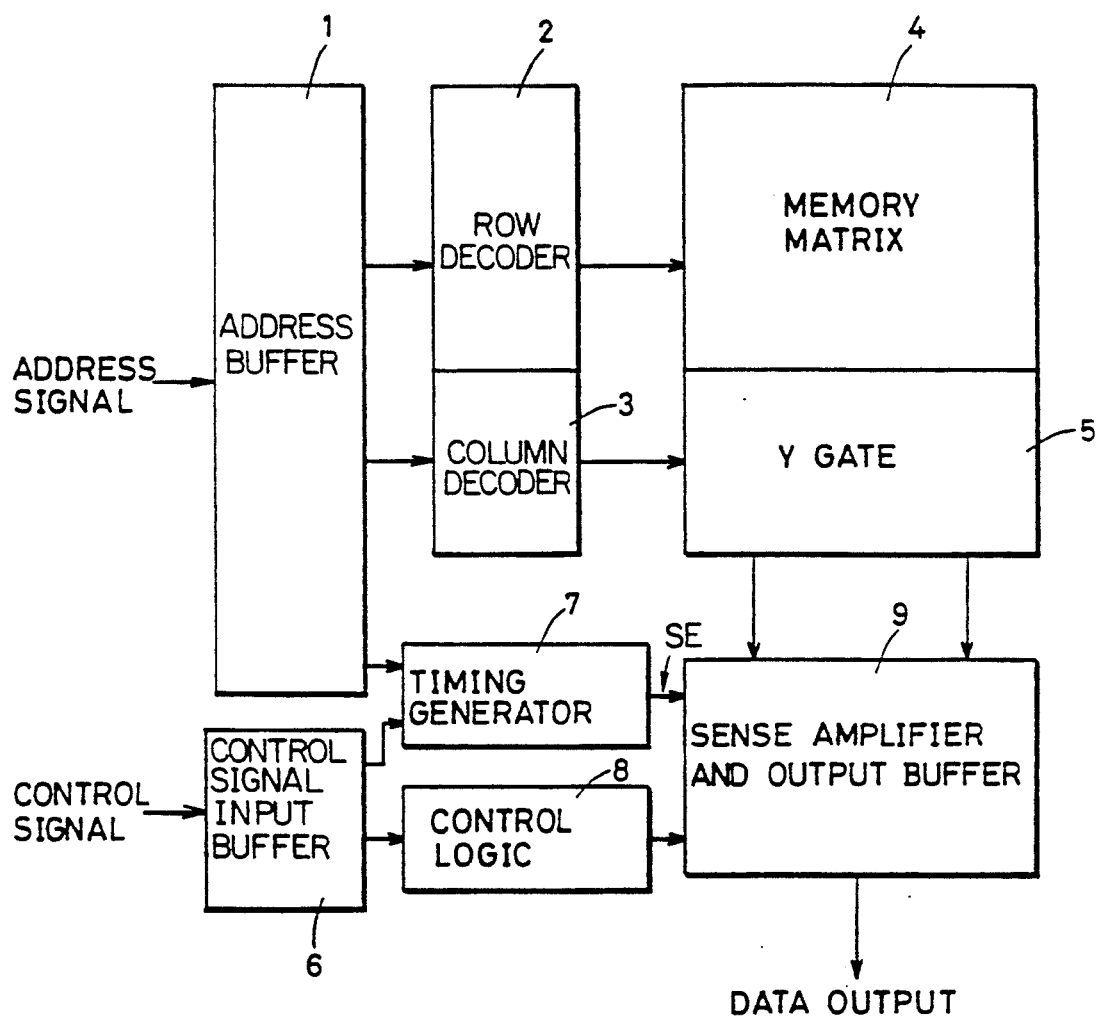
FIG. 7 is a schematic block diagram showing the entire arrangement of a conventional PROM.

The connection of the memory cell to be sensed is represented by an equivalent circuit shown in FIG. 6(b) with the N-channel transistors 216 and 218 and P-channel transistor 217 omitted. In this case, a dummy line to be connected to the P-channel transistor 217 or to the dummy bit line is selected so that a voltage which is intermediate between the potential differences at the node N5 accompanying the information of "1" and "2" in the memory cell from which data are read out may be generated from the node N4.

After the signal $\overline{BE}$ has been brought to "L" level, the signal PC is brought to "L" level as shown in FIG. 3(b) and the signal EQ is brought to "H" level as shown in FIG. 3(c). The signals $\overline{PC}$ and EQ are used to charge the bit line and dummy bit line before the sensing of the memory cell is started by the differential amplifier. When the signal $\overline{PC}$ is brought to "L" level, the P-channel transistors 104 and 217 are rendered conductive, while the N-channel transistor 28 is rendered conductive by the signal EQ being brought to "H" level. The P-channel transistor 104 being rendered conductive causes the dummy bit line to be precharged through the N-channel transistors 105, 102 and 103, while the P-channel transistor 217 being rendered conductive causes the bit line to be precharged through the N-channel transistors 218 and 52 and the column selection transistor 51. At this time, since the N-channel transistor has been rendered conductive, the potentials at the nodes N4 and N5 are equal.

Then, after the signal $\overline{PC}$ has been brought to "H" level and the signal EQ has been brought to "L" level to complete the precharging of the bit line and dummy bit line, a potential difference starts to appear between the potentials at the nodes N4 and N5, at which point of time the sense amplifier activating signal $\overline{SE}$ is brought to "L" level, when the $\overline{SE}$ is brought to "H" level, the sense amplifier is activated and the sense amplifier output is derived from the node N5.

As has been described, according to embodiments of the invention, one of the two-direction input terminals of the latch type sense amplifier is connected to the first reference voltage generating circuit via the first gate transistor and the other is connected to the load and to the selection transistor via the second gate transistor; therefore, the output level of the latch type sense amplifier is never directly transmitted to the bit line and can be reduced below the output level of the second reference voltage. Therefore, by using such latch type sense amplifier, it is possible to achieve speed-up and decreased power consumption.

While in the above-described embodiment, the gate transistors 22 and 23 are employed, any element can be used which allows a potential level at the node N6 to be shifted in response to a voltage from the reference voltage generating circuit 21.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sense amplifier for nonvolatile semiconductor storage devices connected to a memory transistor via a selection transistor and a bit line, comprising:

first reference voltage generating means for generating a first reference voltage, second reference voltage generating means for generating a second reference voltage, a load connected to said bit line via said selection transistor, a latch type sense amplifier including two cross-coupled input/output terminals and adapted to latch information when the input voltage at one of the input/output terminals is higher than the voltage at the other input/output terminal, a first gate transistor connected between the output of said first reference voltage generating means and one of the input/output terminals of said latch type sense amplifier and adapted to be rendered conductive in response to the second reference voltage to apply the first reference voltage to said one input/output terminal, and a second gate transistor connected between said load and the other input/output terminal of said latch type sense amplifier and adapted to be rendered conductive in response to said second reference voltage, wherein said latch type sense amplifier includes: third and fourth transistors connected in series and having inputs connected to said second gate transistor and outputs connected to said first gate transistor, and fifth and sixth transistors connected in series and having their inputs connected to said first gate transistor and their outputs connected to said second gate transistor.

2. A sense amplifier for nonvolatile semiconductor storage devices as set fourth in claim 1, further including:

seventh and eighth transistors adapted to be rendered conductive in response to an activation signal for activating said latch type sense amplifier.

3. A sense amplifier as set forth in claim 2, wherein said first to eighth transistors are MOSFET transistors each having a source, a drain and a gate.

4. A sense amplifier as set forth in claim 3, wherein the gates of the third and fourth transistors are coupled to the second reference voltage generating means through the second gate transistor, the gates of the fifth and sixth transistors are coupled to the first reference voltage generating means through the first gate transistor.

5. A sense amplifier as set forth in claim 4, wherein the drains of the third and fourth transistors are connected to the gates of the fifth and sixth transistors, and the drains of the fifth and sixth transistors are connected to the gates of the third and fourth transistors.

6. A sense amplifier as set forth in claim 5, wherein the activation signal is applied to the gates of the seventh and eighth transistors.

7. A sense amplifier as set forth in claim 6, wherein the drain of the seventh transistor is connected to the sources of the third and fifth transistors, and the drain of the eighth transistor is connected to the sources of the fourth and sixth transistors.

8. A sense amplifier for nonvolatile semiconductor storage devices as set forth in claim 1, wherein said first reference voltage generating means includes transistors adapted to generate reference voltages which are $\frac{1}{2}$ of a difference between voltages which are applied at the other input/output terminal of the latch type sense amplifier when said memory transistor is nonconductive and conductive, respectively.

9. A sense amplifier for nonvolatile semiconductor storage devices as set fourth in claim 1, wherein said second reference voltage generating means includes a plurality of transistors connected in series between a power source and ground and adapted to generate a second reference voltage for controlling voltage applied to the other input/output terminal of said latch type sense amplifier, and said second gate transistor includes an element adapted to be rendered conductive in response to said second reference voltage being lower than the voltage appearing at the other input/output terminal of said latch type sense amplifier.

10. A nonvolatile semiconductor memory device comprising:

a memory array including a plurality of nonvolatile memory cells arranged in rows and columns;

a plurality of bit line pairs corresponding to said columns, each bit line pair being directly connected to all nonvolatile memory cells in a respective column;

a latch type sense amplifier;

limiting means connected between said latch type sense amplifier and each said bit lien for limiting an input voltage level supplied to said sense amplifier from the bit line;

said latch type sense amplifier comprises two cross-coupled inverter circuits each having an input terminal and an output terminal, the input terminal of each inverter circuit connected to the output terminal of the other inverter circuit, one of said inverter output terminals forming an output for the sense amplifier; and each input terminal is connected to said limiting means.

11. A nonvolatile semiconductor memory device as recited in claim 10, wherein said limiting means comprises:

a first gate transistor connected between the bit line and one of said input terminals;

a second gate transistor connected to the other one of said input terminals;

a first reference voltage generating means for activating each said gate transistor;

a load circuit connected to the first gate transistor and a second reference voltage generating means connected to the second gate transistor.

* * * * *